(12) United States Patent
Chuang

(10) Patent No.: US 10,943,819 B2
(45) Date of Patent: Mar. 9, 2021

(54) SEMICONDUCTOR STRUCTURE HAVING A PLURALITY OF CAPPED PROTRUSIONS

(71) Applicant: NANYA TECHNOLOGY CORPORATION, New Taipei (TW)

(72) Inventor: Ying-Cheng Chuang, Taoyuan (TW)

(73) Assignee: Nanya Technology Corporation, New Taipei (TW)

(*) Notice: Subject to any disclaimer, the term of this patent is extended or adjusted under 35 U.S.C. 154(b) by 0 days.

(21) Appl. No.: 16/296,627

(22) Filed: Mar. 8, 2019

(65) Prior Publication Data
US 2020/0203221 A1   Jun. 25, 2020

Related U.S. Application Data

(60) Provisional application No. 62/782,662, filed on Dec. 20, 2018.

(51) Int. Cl.
| H01L 29/06 | (2006.01) |
| H01L 29/78 | (2006.01) |
| H01L 21/768 | (2006.01) |
| H01L 21/762 | (2006.01) |

(52) U.S. Cl.
CPC ...... *H01L 21/76832* (2013.01); *H01L 21/762* (2013.01); *H01L 21/76802* (2013.01); *H01L 29/0649* (2013.01); *H01L 29/785* (2013.01); *H01L 29/7851* (2013.01)

(58) Field of Classification Search
CPC .................. H01L 29/0649; H01L 29/785; H01L 29/7851
See application file for complete search history.

(56) References Cited

U.S. PATENT DOCUMENTS

| 7,521,322 | B2* | 4/2009 | Tang ................. H01L 21/28132 438/137 |
| 7,776,692 | B2* | 8/2010 | Yoon ................. H01L 29/66666 438/270 |
| 7,989,292 | B2* | 8/2011 | Cho ................. H01L 21/823487 438/268 |
| 8,093,122 | B2* | 1/2012 | Lee .................. H01L 29/66666 438/209 |
| 8,237,220 | B2* | 8/2012 | Sung ................. H01L 27/10891 257/328 |
| 8,592,899 | B2* | 11/2013 | Jang ................. H01L 27/10876 257/334 |
| 8,652,897 | B2* | 2/2014 | Kim ................... H01L 45/1233 438/210 |

(Continued)

OTHER PUBLICATIONS

Office Action and Search Report issued in CN application No. 108113783 dated Jul. 31, 2020 (with English Abstract attached).

*Primary Examiner* — Ida M Soward
(74) *Attorney, Agent, or Firm* — Muncy, Geissler, Olds & Lowe, P.C.

(57) ABSTRACT

The present disclosure provides a semiconductor structure and a method of manufacturing the semiconductor structure. The semiconductor structure includes a base, a plurality of islands, and an isolation layer. At least one of the plurality of islands includes a pillar extending from an upper surface of the base, a protrusion connected to the pillar, a capping layer disposed on the protrusion, and a passivation liner disposed on sidewalls of the protrusion and the capping layer. The isolation layer surrounds the islands.

6 Claims, 20 Drawing Sheets

(56) References Cited

U.S. PATENT DOCUMENTS

| | | | |
|---|---|---|---|
| 8,759,906 B2* | 6/2014 | Sung | H01L 29/7827 |
| | | | 257/329 |
| 8,962,455 B2* | 2/2015 | Choi | H01L 21/76841 |
| | | | 438/478 |
| 9,023,723 B2* | 5/2015 | Chang | H01L 27/10891 |
| | | | 438/586 |
| 9,117,928 B2* | 8/2015 | Zahurak | H01L 27/24 |
| 9,343,559 B2* | 5/2016 | Glass | H01L 21/845 |
| 10,026,737 B1* | 7/2018 | Ching | H01L 29/785 |
| 10,037,912 B2* | 7/2018 | Hsiao | H01L 21/76831 |
| 10,607,999 B2* | 3/2020 | Varghese | H01L 27/10823 |
| 10,797,056 B2* | 10/2020 | Kim | H01L 27/10855 |
| 10,804,402 B2* | 10/2020 | Chen | H01L 21/743 |
| 10,818,671 B2* | 10/2020 | Lee | H01L 23/53295 |
| 2011/0101447 A1* | 5/2011 | Cho | H01L 27/10885 |
| | | | 257/329 |
| 2016/0233298 A1* | 8/2016 | Webb | H01L 21/823821 |
| 2017/0194480 A1* | 7/2017 | Chen | H01L 29/1054 |
| 2018/0350800 A1* | 12/2018 | Chang | H01L 29/516 |
| 2019/0131431 A1* | 5/2019 | Cheng | H01L 29/66772 |
| 2019/0157156 A1* | 5/2019 | Chen | H01L 21/76224 |
| 2019/0164882 A1* | 5/2019 | Chen | H01L 27/0886 |
| 2019/0355724 A1* | 11/2019 | Chiang | H01L 27/0922 |
| 2020/0006075 A1* | 1/2020 | Wang | H01L 21/28123 |
| 2020/0006329 A1* | 1/2020 | Lilak | H01L 21/823418 |
| 2020/0105608 A1* | 4/2020 | Yu | H01L 29/0673 |

* cited by examiner

SEMICONDUCTOR STRUCTURE HAVING A PLURALITY OF CAPPED PROTRUSIONS

PRIORITY CLAIM AND CROSS-REFERENCE

This application claims the priority benefit of U.S. provisional application Ser. No. 62/782,662, filed on Dec. 20, 2018. The entirety of the above-mentioned patent application is hereby incorporated by reference herein and made a part of this specification.

TECHNICAL FIELD

The present disclosure relates to a semiconductor structure and a method of processing the semiconductor structure.

DISCUSSION OF THE BACKGROUND

Semiconductor devices and integrated circuits are becoming more highly integrated. As a result, ongoing research seeks to improve characteristics of such devices and circuits, and to secure desirable process advantages. In semiconductor memory devices, as the memory capacity of such devices increases, a critical dimension of patterns in the device is reduced. As a result, photolithography processes for forming a pattern over a wafer are vital components of the semiconductor manufacturing process.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a base, a plurality of islands, and an isolation layer. At least one of the plurality of islands includes a pillar, a protrusion, a capping layer, and a passivation liner; the pillar extends from an upper surface of the base, the protrusion is connected to the pillar, the capping layer is disposed on the protrusion, and the passivation liner is disposed on sidewalls of the protrusion and is the capping layer. The isolation layer encircles the islands.

In some embodiments, the islands have a height in a range between 180 and 400 nm.

In some embodiments, the protrusions have a height in a range between 30 and 200 nm.

In some embodiments, the semiconductor structure further includes an insulating layer sandwiched between the protrusions and the capping layer, and sidewalls of the insulating layer are covered by the passivation liner.

In some embodiments, the base, the pillars and the protrusions are integrally formed.

In some embodiments, a top surface of the capping layer is coplanar with an upper surface of the isolation layer.

Another aspect of the present disclosure provides a method of processing a semiconductor structure. The method includes steps of providing a supporting substrate; forming a capping layer and a hardmask stack on the supporting substrate; patterning the hardmask stack to form a plurality of blocks overlying the capping layer; patterning the capping layer using the blocks as a mask; patterning the supporting substrate through the remaining capping layer to form a plurality of protrusions; depositing a passivation liner on sidewalls of the remaining capping layer and the protrusions; patterning the remaining supporting substrate to form a plurality of pillars underlying respective the protrusions; and depositing a first isolation layer to encircle the pillars, the protrusions, and the remaining capping layer.

In some embodiments, the hardmask stack comprises a first is sub-stack in contact with the capping layer and a second sub-stack disposed on the first sub-stack; and the step of patterning the hardmask stack to form the blocks includes steps of patterning the second sub-stack to form a plurality of strips spaced apart from each other by a given distance; depositing a sacrificial layer on the strips; patterning the sacrificial layer to form a plurality of through-holes over the strips; patterning the second sub-stack using the remaining sacrificial layer as a mask to form a plurality of openings in the second sub-stack; and patterning the first sub-stack using the remaining second sub-stack as a mask.

In some embodiments, the strips include a two-layered structure and a three-layered structure in a staggered configuration.

In some embodiments, the patterning of the sacrificial layer includes steps of coating a photoresist layer having a plurality of through-holes disposed over the strips on the sacrificial layer; and removing a portion of the sacrificial layer exposed through the through-holes.

In some embodiments, the method of processing a semiconductor structure further includes a step of depositing an antireflective coating layer on the underlying layer before the coating of the photoresist layer.

In some embodiments, the deposition of the passivation liner on the sidewalls of the capping layer and the protrusions includes steps of depositing a passivation liner on a top surface of the capping layer, the sidewalls of the capping layer and the protrusions, and an upper surface of the supporting substrate; and removing the passivation liner from the top surface of the capping layer and the upper surface of the is supporting substrate.

In some embodiments, the passivation liner has a uniform thickness.

In some embodiments, the passivation liner is an atomic layer deposition layer.

In some embodiments, the method further includes steps of depositing an insulating layer on the supporting substrate before the forming of the capping layer and the hardmask stack; and patterning the insulating layer during the patterning of the capping layer.

In some embodiments, the method further includes a step of performing a planarizing process to expose an upper surface of the capping layer through the isolation layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
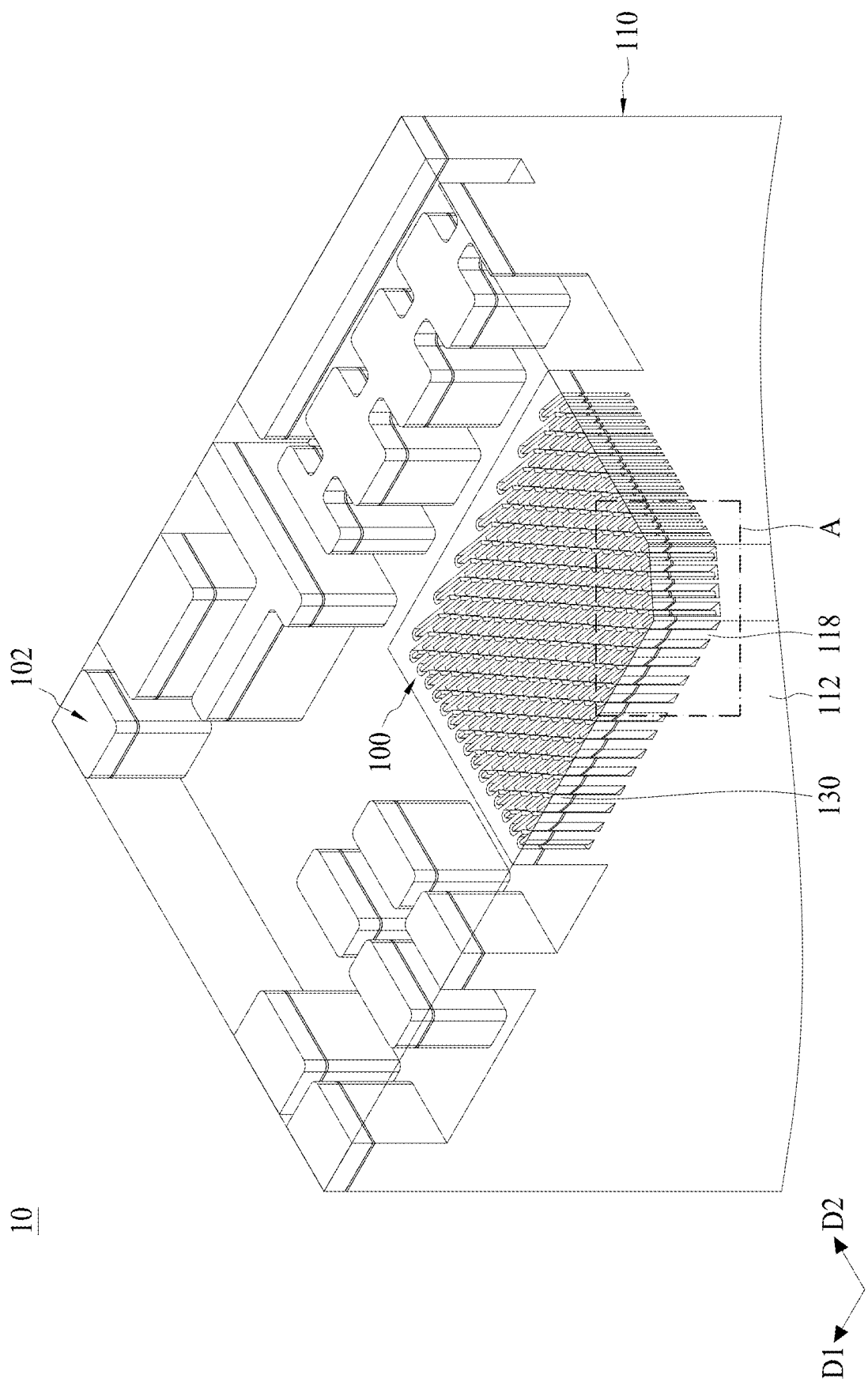
FIG. 1 is a perspective view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing is particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
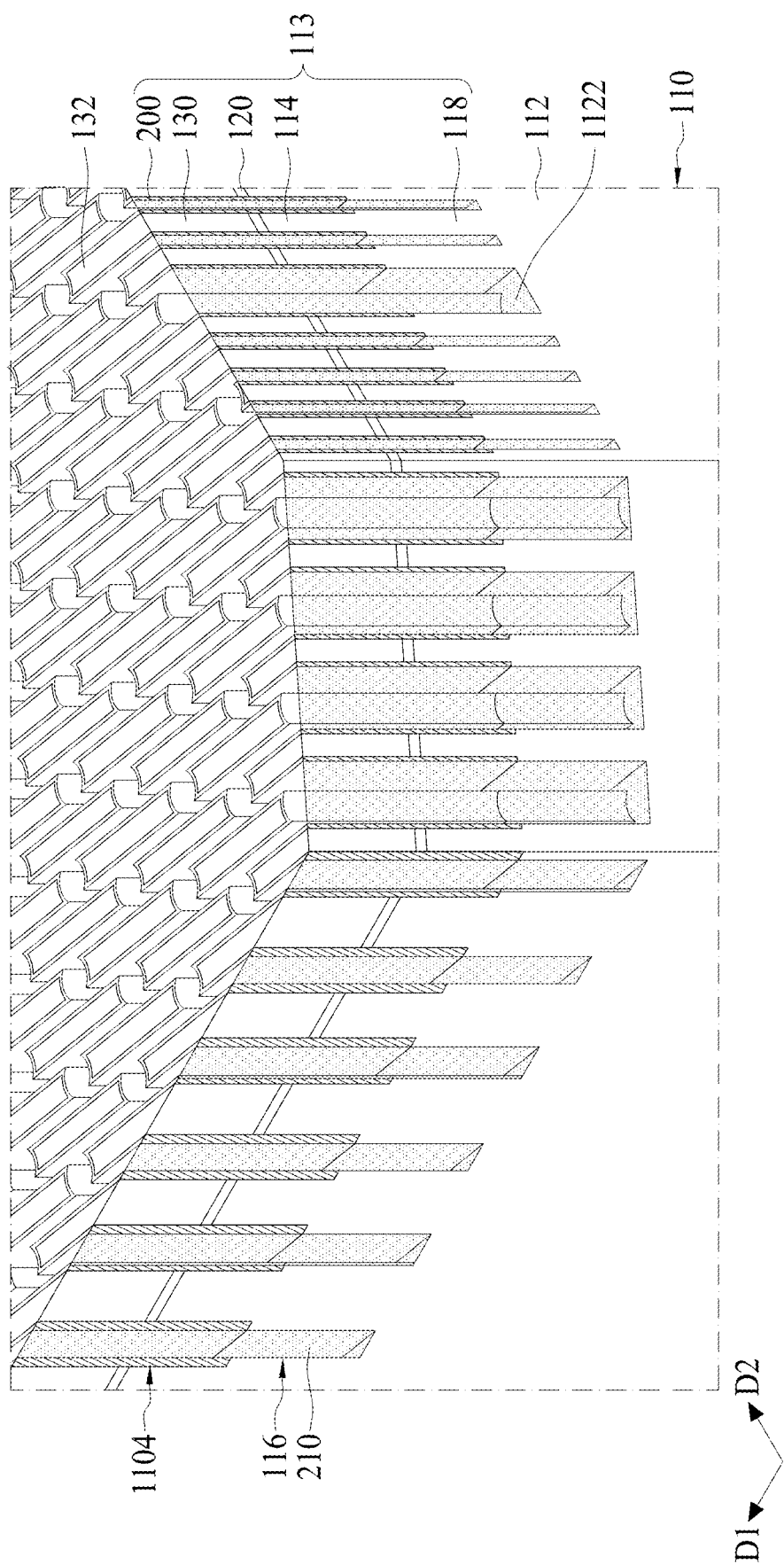
FIG. 2 is a close-up view of an area A of FIG. 1.

FIG. 1 is a perspective view of a semiconductor structure 10 in accordance with some embodiments of the present disclosure, and FIG. 2 is a close-up view of an area A of FIG. 1. Referring to FIGS. 1 and 2, the semiconductor structure 10 includes an array area 100 and a peripheral region 102 at least partially surrounding the array area 100. In some embodiments, the array area 100 includes a base 112, a plurality of islands 113 connected to the base 112, and an isolation layer 210 received between adjacent pairs of such islands 113. In some embodiments, the island 113 includes a protrusion 114, a pillar 118, an insulating layer 120, a capping layer 130, and a passivation liner 200. The pillar 118 extends from a surface 1122 of the base 112, and the protrusion 114 is connected to the pillar 118. In some embodiments, the base 112, the protrusions 114 and the pillars 118 are integrally formed. In some embodiments, the base 112, the protrusions 114 and the pillars 118 are made of lightly doped monocrystalline silicon. In some embodiments, the insulating layer 120 is disposed on the protrusions 114, and the capping layer 130 is disposed on the insulating layer 120. In some embodiments, the passivation liner 200 is disposed is on sidewalls of the protrusions 114, the insulating layer 120, and the capping layer 130.

In some embodiments, the islands 113 in the array area 100 may be used for fabricating field effect vertical transistors. In some embodiments, the protrusions 114 have a height in a range between 30 and 200 nm. In some embodiments, the islands 113 have a height in a range between 180 and 400 nm. In some embodiments, the passivation liner 200 provides passivation during the etching process to protect against undercutting or notches of the sidewalls 1142 of the protrusions 114. In some embodiments, a top surface 132 of the capping layer 130 is coplanar with an upper surface 212 of the isolation layer 210. In some embodiments, the insulating layer 120 includes oxide, the capping layer 130 includes nitride, the passivation liner 200 includes dielectric such as oxide or nitride, and the isolation layer 210 includes oxide.

Figure 3:
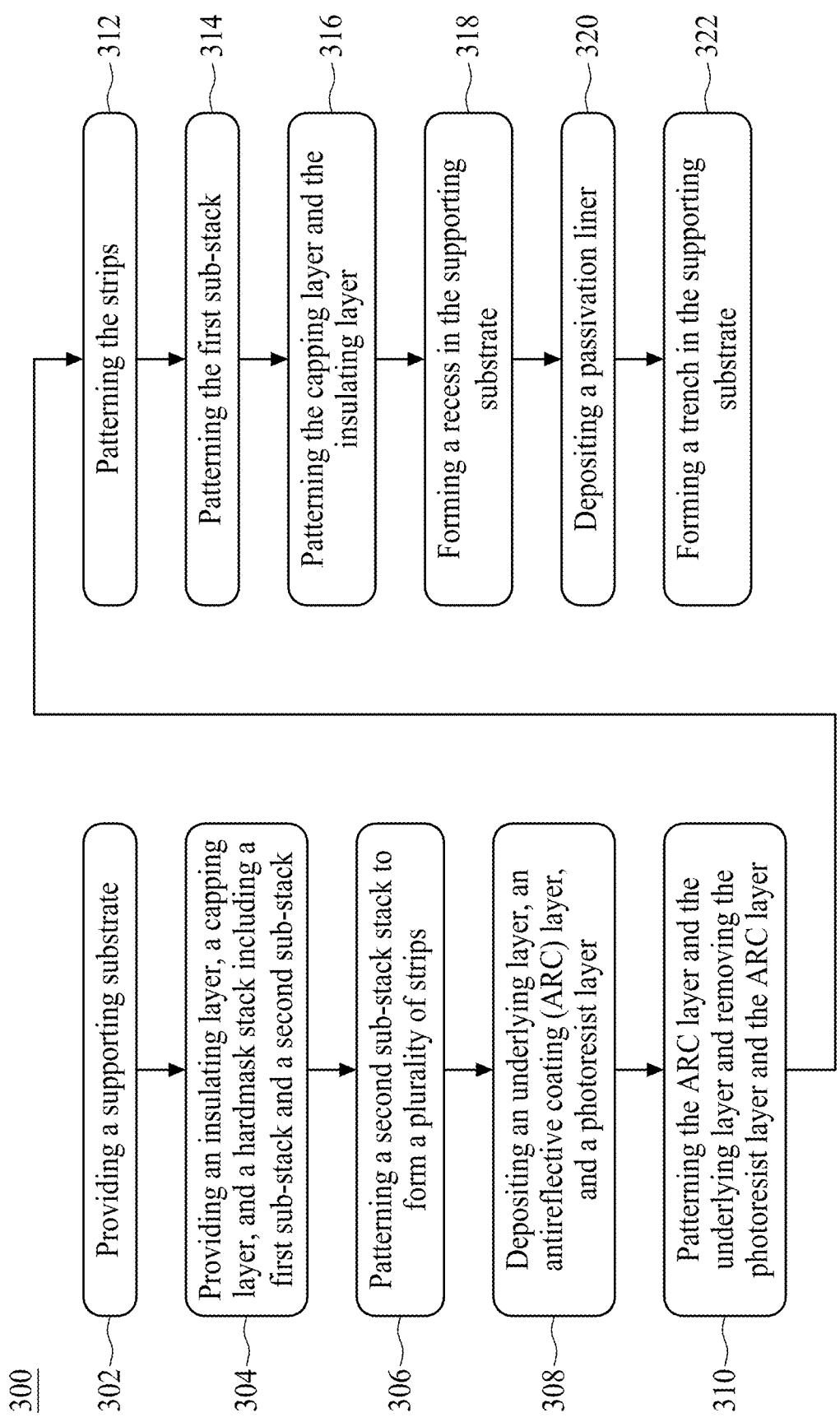
FIG. 3 is a flow diagram illustrating a method of manufacturing a semiconductor structure, in accordance with some embodiments of the present disclosure.

FIG. 3 is a flow diagram illustrating a method 300 of manufacturing a semiconductor structure 10 in accordance with some embodiments of the present disclosure. FIGS. 4 to 20 are schematic diagrams illustrating various fabrication stages constructed according to the method 300 for manufacturing the semiconductor structure 10 in accordance with some embodiments of the present disclosure. The stages shown in FIGS. 4 to 20 are also illustrated schematically in the flow diagram in FIG. 3. In the subsequent discussion, the fabrication stages shown in FIGS. 4 to 20 are discussed in reference to the process steps shown in FIG. 3.

Figure 4:
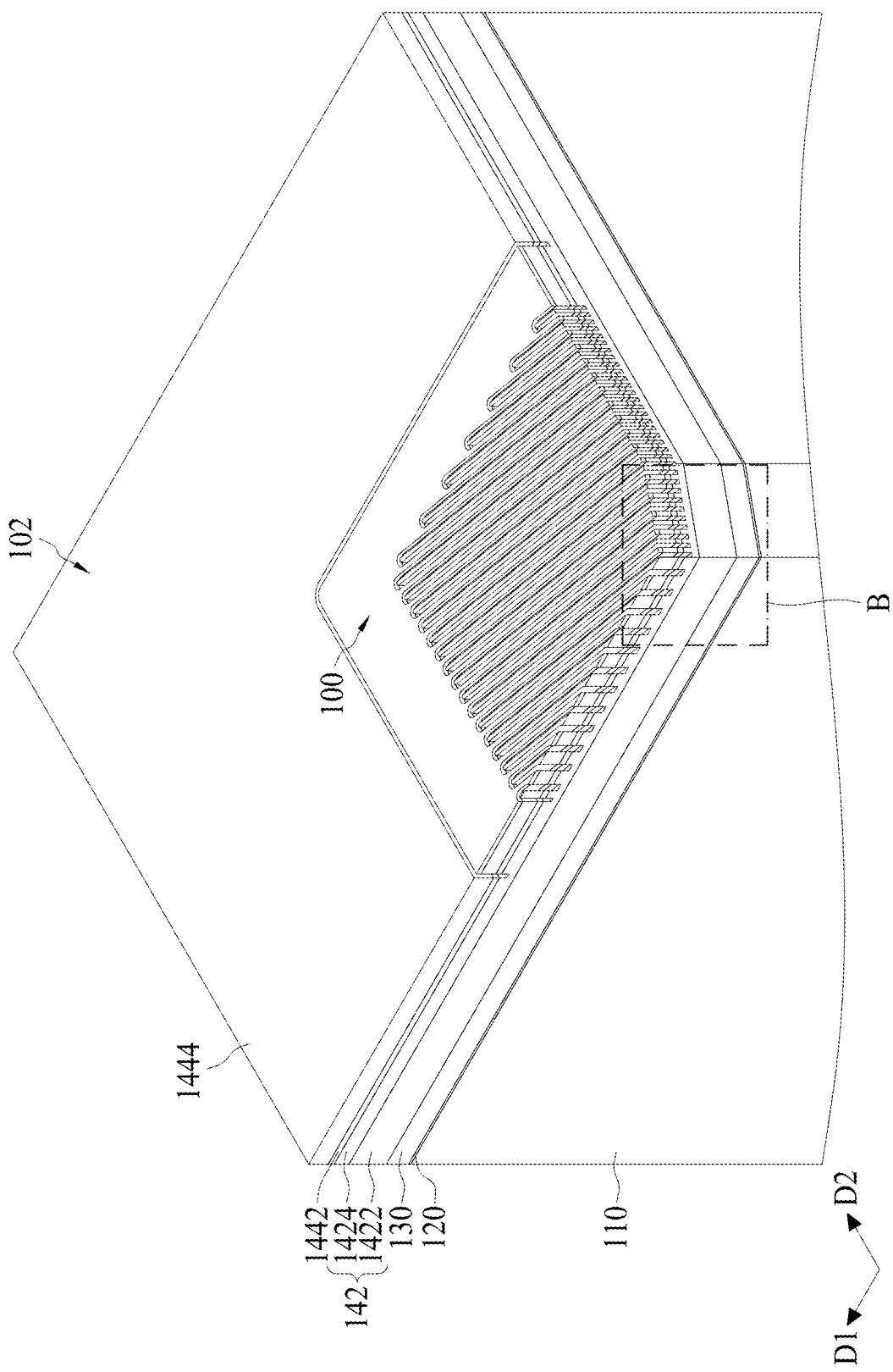
FIG. 4 illustrates a perspective view of an intermediate stage in the formation of a semiconductor structure in accordance with some embodiments of the present disclosure.
Figure 5:
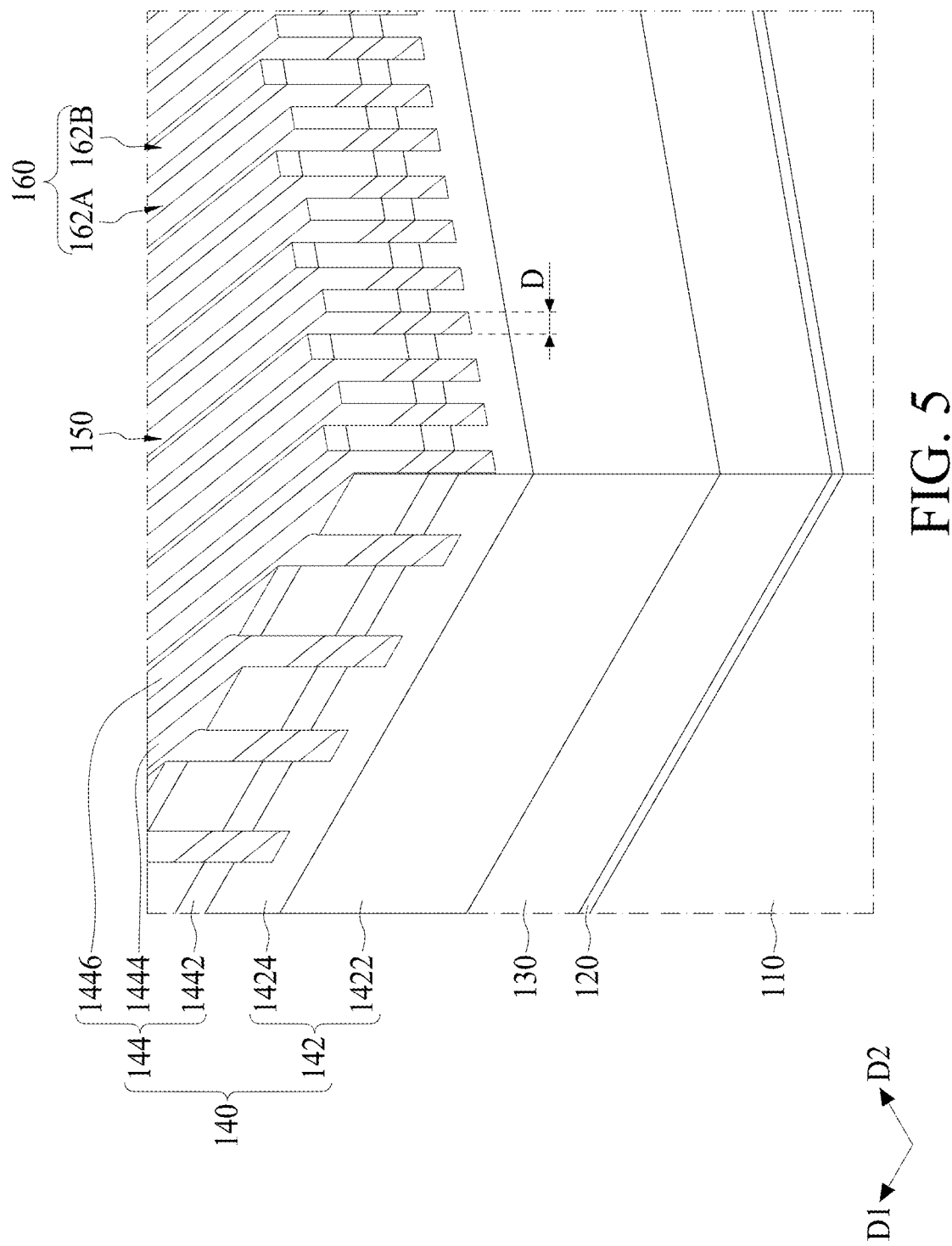
FIG. 5 is a close-up view of an area B of FIG. 4.

Referring to FIGS. 4 and 5, a supporting substrate 110 to be processed is provided according to step 302 in FIG. 3. In some embodiments, the supporting substrate 110 includes bulk is semiconductor material, for example silicon. In some embodiments, the supporting substrate 110 may be lightly doped monocrystalline silicon. In some embodiments, the supporting substrate 110 may be a p-type substrate.

Next, in some embodiments, a thin insulating layer 120, a capping layer 130, and a hardmask stack 140 are sequentially formed on the supporting substrate 110 according to step 304 in FIG. 3. In some embodiments, the insulating layer 120 is in contact with the supporting substrate 110. In some embodiments, the insulating layer 120 includes oxide such as silicon oxide. In some embodiments, the insulating layer 120 is formed using a chemical vapor deposition (CVD) process or a thermal oxidation process. In some embodiments, the capping layer 130 is disposed on the insulating layer 120. In some embodiments, the capping layer 130 includes nitride, e.g., silicon nitride. In some embodiments, the capping layer 130 may be formed using a CVD process.

In some embodiments, the hardmask stack 140 includes a first sub-stack 142 and a second sub-stack 144 sequentially formed on the capping layer 130. In some embodiments, the first sub-stack 142 includes an underlying layer 1422 in contact with the capping layer 130, and an overlying layer 1424 disposed on the underlying layer 1422; wherein the overlying layer 1424 has a composition different from that of the underlying layer 1422 to enable selective etching of each relative to the other. In some embodiments, the underlying layer 1422 includes carbon, and the overlying layer 1424 includes nitride. In some embodiments, the underlying layer 1422 and the overlying layer 1424 are formed using CVD processes.

In some embodiments, the second sub-stack layer 144 includes a first layer 1442 in contact with the overlying layer 1424, and a second layer 1444 disposed on the first layer 1442. In some embodiments, the first layer 1442 includes polysilicon and the second layer 1444 includes oxide, e.g., silicon oxide. In some embodiments, the second sub-stack 144 may optionally include a third layer 1446 of oxide disposed on the second layer 1444. In some embodiments, the third layer 1446 includes silicon oxide. In some embodiments, the first layer 1442, the second layer 1444, and the third layer 1446 are formed using CVD processes. In some embodiments, the deposition of the first layer 1442 and the second layer 1444 may be performed in-situ to save processing time and reduce possibility of contamination. As used herein, the term "in-situ" is used to refer to processes in which the supporting substrate 110 being processed is not exposed to an external ambient (e.g., external to the processing system) environment.

Next, the second sub-stack 144 is patterned according to step 306 in FIG. 3. Accordingly, a plurality of grooves 150 are formed in the second sub-stack 144. In some embodiments, the remaining second sub-stack 144 includes a plurality of strips 160 extending in a first direction D1. In some embodiments, the strips 160 are spaced apart from each other by a given distance D in a second direction D2 different from the first direction D1. In some embodiments, the strips 160 may include two-layered structures 162A and/or three-layered structures 162B. In some embodiments, the two-layered structures 162A include the first layer 1442 and the second layer 1444 sequentially formed on the capping layer 130. In some embodiments, the three-layered structures 162B include the first layer 1442, the second layer 1444 and the third layer 1446 sequentially formed on the is capping layer 130. In some embodiments, the two-layered structures 162A and the three-layered structures 162B are alternately arranged in the second direction D2. In some embodiments, the second sub-stack 144 is patterned using a double patterning technology (DPT). In some embodiments, the DPT process stops at the overlying layer 1424 of the first sub-stack 142. In some embodiments, the second sub-stack 144 may be patterned using a quadruple patterning technology (QPT) process.

Figure 6:
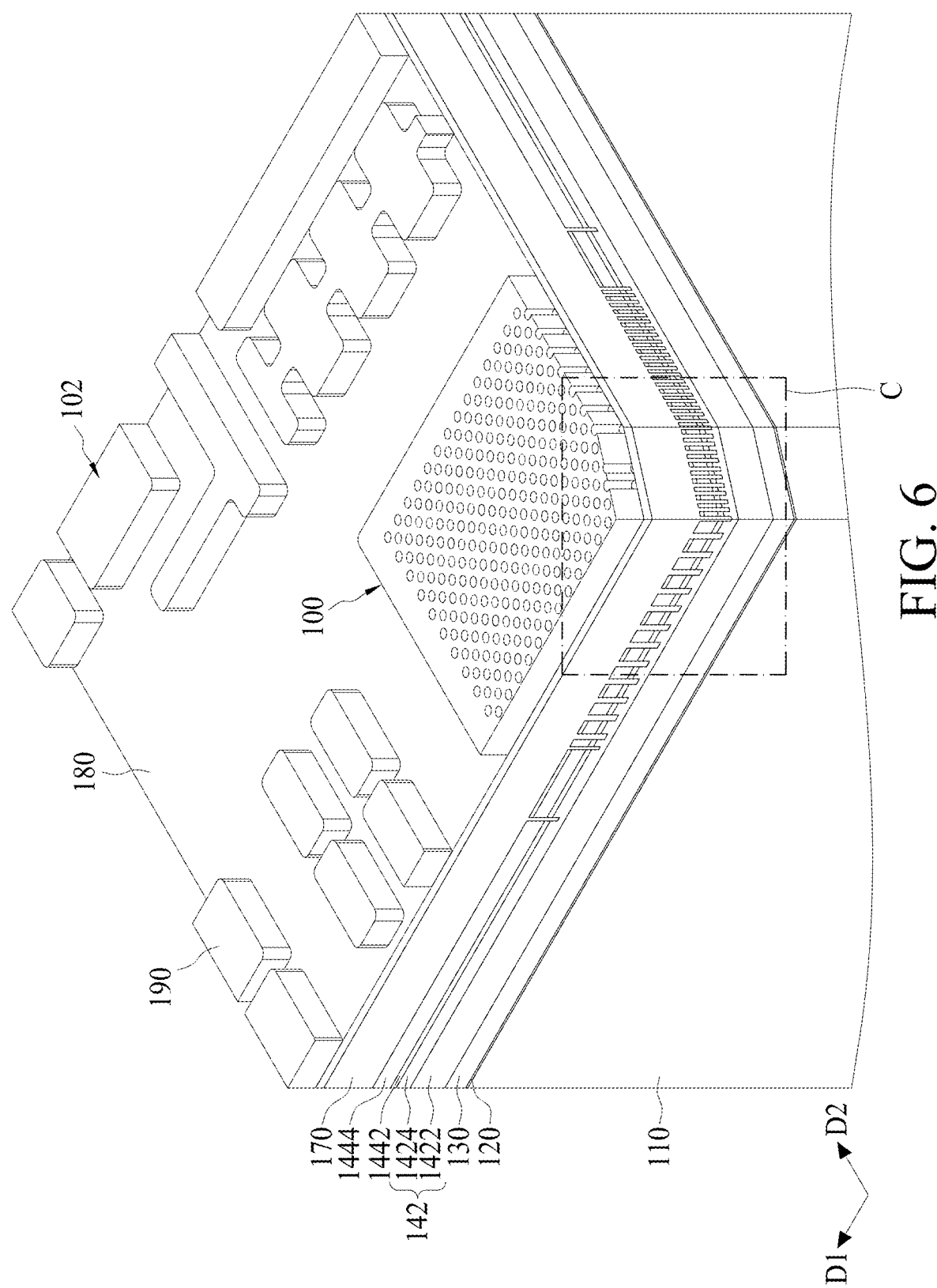
FIG. 6 illustrates a perspective view of an intermediate stage in the formation of the semiconductor structure in accordance with some embodiments of the present disclosure.
Figure 7:
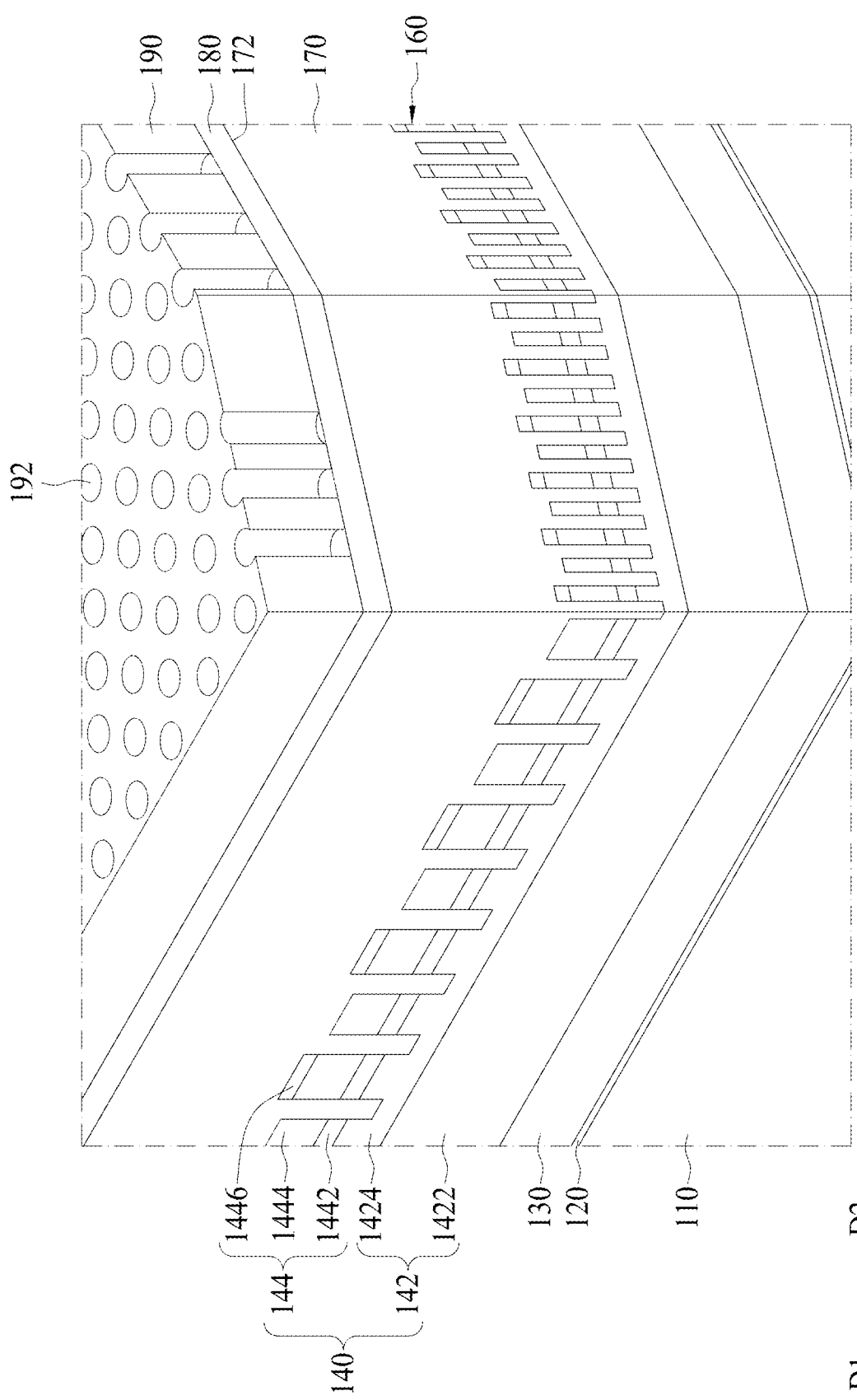
FIG. 7 is a close-up view of an area C of FIG. 6.

Referring to FIGS. 6 and 7, a sacrificial layer 170, an antireflective coating (ARC) layer 180, and a photoresist layer 190 are sequentially formed according to step 308 in FIG. 3. In some embodiments, the sacrificial layer 170 is disposed on the strips 160 and in the grooves 150. In some embodiments, the sacrificial layer 170 has a thickness sufficient to fill the grooves 150. In some embodiments, the sacrificial layer 170 has a flat upper surface 172. In some embodiments, the sacrificial layer 170 includes carbon. In some embodiments, the sacrificial layer 170 may be formed using a CVD process. In some embodiments, after the deposition of the sacrificial layer 170, a polish process may be performed to obtain the flat upper surface 172.

In some embodiments, the ARC layer 180 is formed between the sacrificial layer 170 and the photoresist layer 190 in order to eliminate problems associated with reflection of light when exposing the photoresist layer 190. In some embodiments, the ARC layer 180 may stabilize an etching selectivity of the sacrificial layer 170. In some embodiments, the ARC layer 180 may include a dielectric such as nitride or oxynitride. In some embodiments, the ARC layer 180 may be formed by a plasma-enhanced CVD (PECVD) process.

FIGS. 6 and 7 show the photoresist layer 190 after having been is patterned by a known photolithography process according to some embodiments. In some embodiments, the photoresist layer 190 includes a plurality of through-holes 192 disposed over the strips 160. In some embodiments, a portion of the ARC layer 180 is exposed through the through-holes 192. In some embodiments, the photoresist layer 190 is patterned by any suitable operation such as photolithography, etching, etc.

Figure 8:
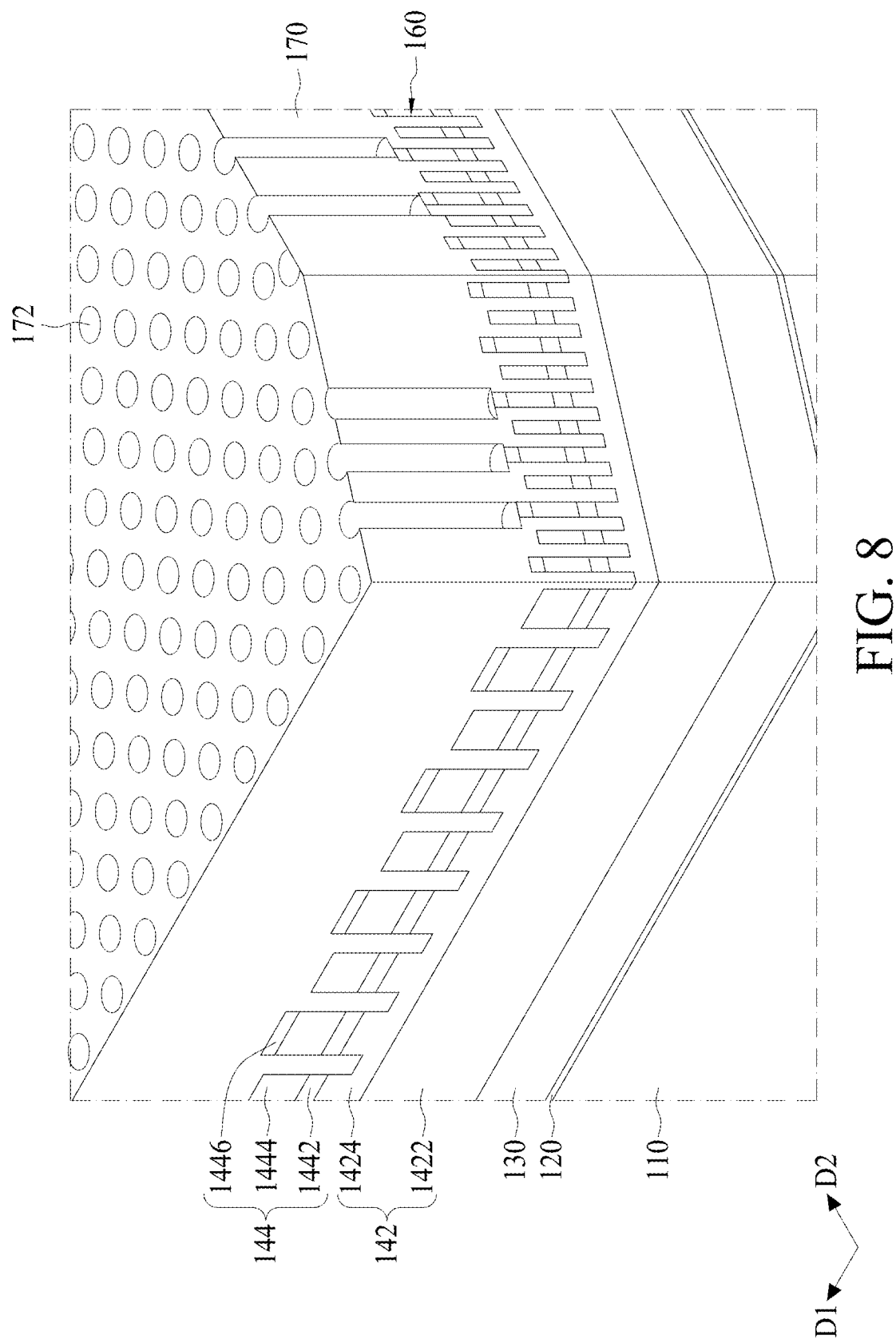
FIGS. 8 through 17 illustrate perspective views of intermediate stages in the formation of a semiconductor structure fragment in accordance with some embodiments of the present disclosure.

Referring to FIG. 8, portions of the sacrificial layer 170 and the ARC layer 180 exposed through the photoresist layer 190 are removed according to step 310 in FIG. 3. In some embodiments, the portions of the sacrificial layer 170 and the ARC layer 180 are etched away using the photoresist layer 190 as a mask. In some embodiments, the sacrificial layer 170 and the ARC layer 180 are removed by any suitable operation, such as dry etching. In some embodiments, the remaining sacrificial layer 170 includes a plurality of through-holes 172. In some embodiments, portions of the strips 160 are exposed to the through-holes 172. In some embodiments, the remaining sacrificial layer 170 serves as a hardmask when the strips 160 are subsequently patterned. In some embodiments, the photoresist layer 190 is then removed using an ashing process or a wet strip process, wherein the wet strip process may chemically alter the photoresist layer 190 so that it no longer adheres to the remaining ARC layer 180. In some embodiments, the ARC layer 180 is then removed to expose the remaining sacrificial layer 170.

Figure 9:
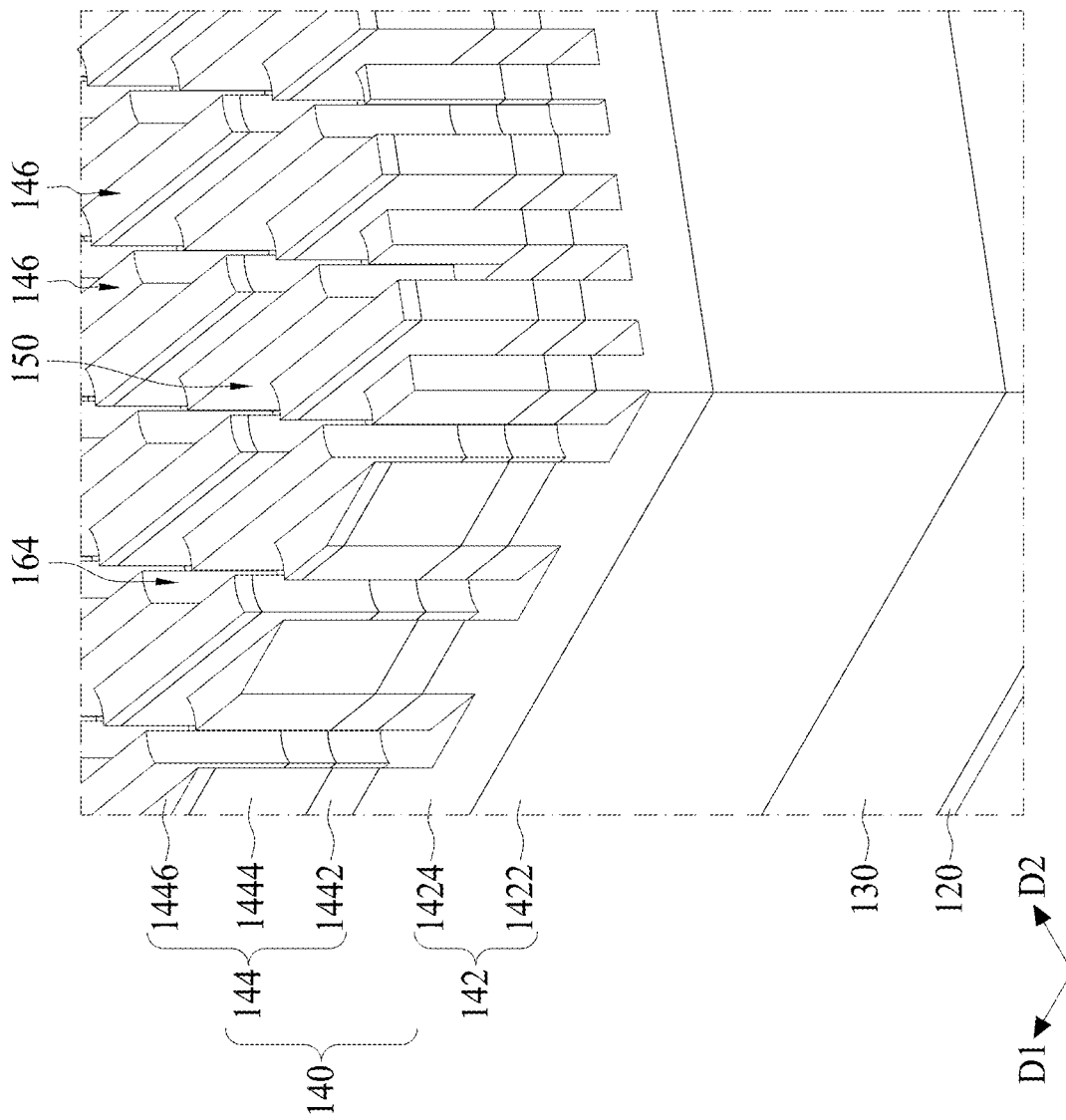

Referring to FIG. 9, in some embodiments, the strips 160 (as shown in FIG. 5) are patterned according to step 312 in FIG. 3. Accordingly, a plurality of openings 164 are formed in the strips 160. In some embodiments, the openings 164 communicate with the grooves 150. In some embodiments, the remaining second sub-stack 144 includes a plurality of blocks 146 spaced apart from each other by the grooves 150 and the openings 164. In some embodiments, the block 146 serves as a hardmask to be used for forming a pattern in the overlying layer 1424 of the first sub-stack 142. In some embodiments, the patterning of the strips 160 stops at the overlying layer 1424. In some embodiments, the strips 160 are patterned by any suitable operation, such as dry etching.

Figure 10:
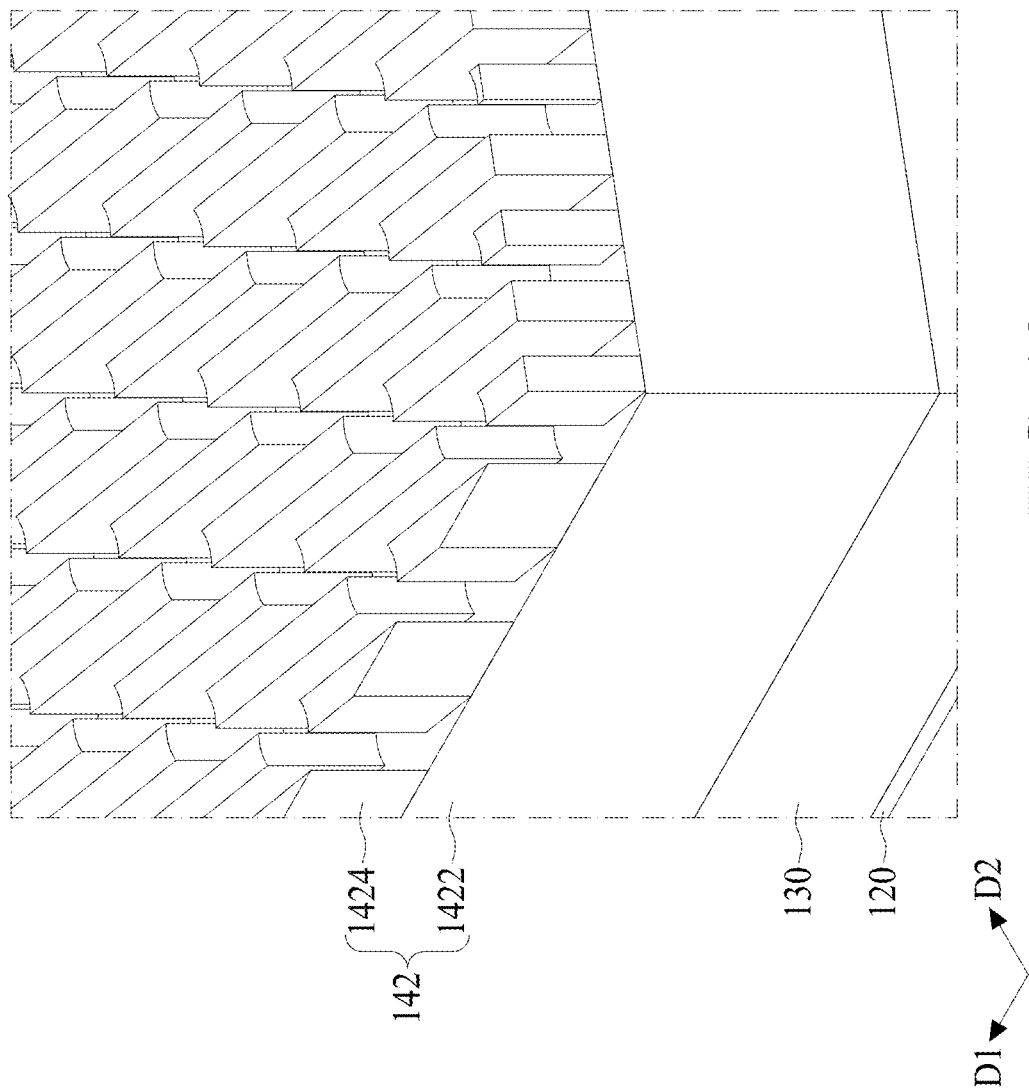
Figure 11:
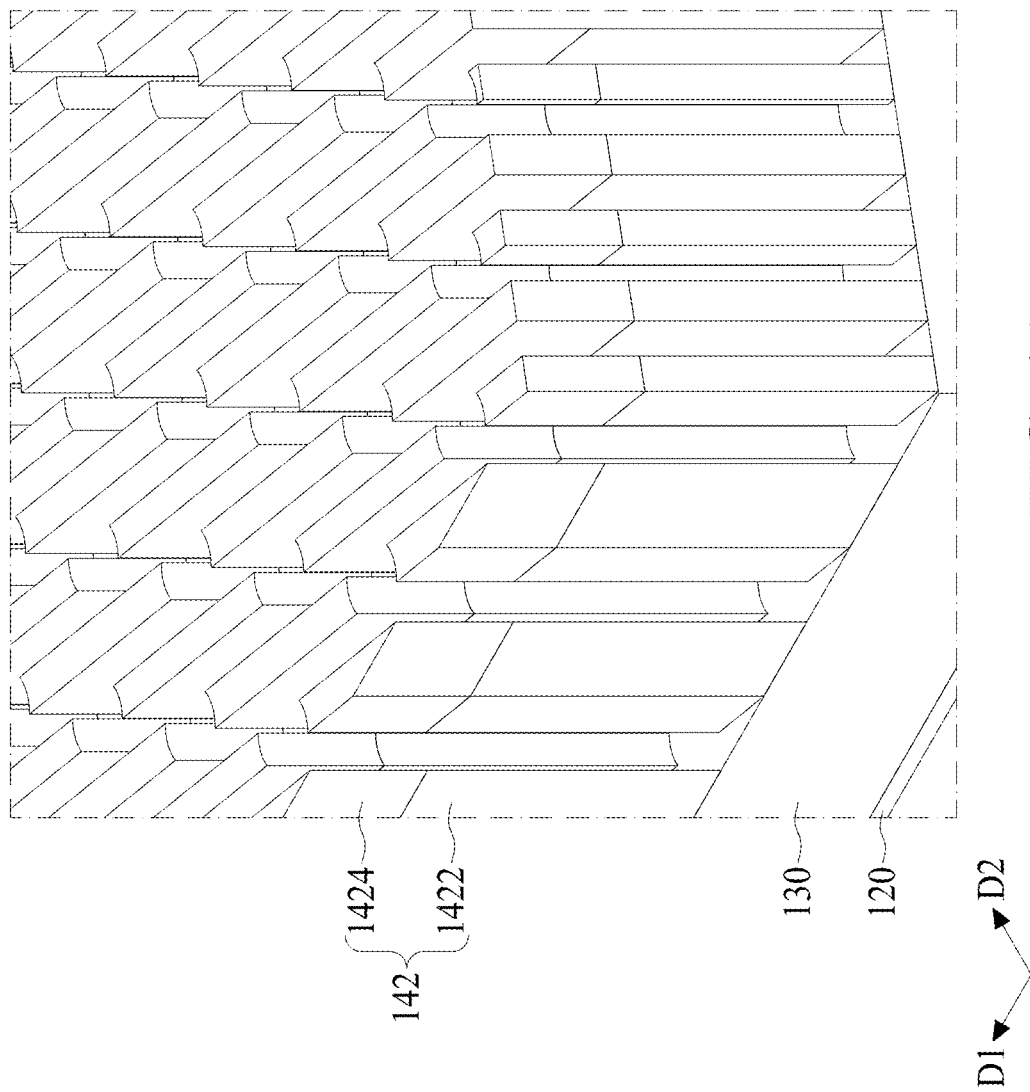

Referring to FIGS. 10 and 11, in some embodiments, the first sub-stack 142 is patterned by removing portions of the overlying layer 1424 and the underlying layer 1422 according to step 314 in FIG. 3. In some embodiments, the first sub-stack 142 is patterned to define regions where the capping layer 130 and the insulating layer 120 are to be subsequently etched. In some embodiments, the overlying layer 1424 is etched selectively relative to the underlying later 1422.

Referring again to FIGS. 9 and 10, in some embodiments, the overlying layer 1424 is etched to remove a determined portion exposed through the blocks 146. In some embodiments, the determined portion of the overlying layer 1424 is removed by any suitable operation, such as dry etching. In some embodiments, the patterning of the overlying layer 1424 stops at the underlying layer 1422. After the patterning of the overlying layer 1424, the blocks 146 are removed from the remaining overlying layer 14224 by any suitable operation. In some embodiments, the remaining overlying layer 1424 servers as a hardmask to be used for patterning the underlying layer 1422.

Referring again to FIG. 11, the portion of the underlying layer 1422 exposed through the remaining overlying layer 1424 is removed by any suitable operation, such as dry etching. In some embodiments, the patterning of the underlying layer 1422 stops at the capping layer 130. After the patterning of the underlying layer 1424, the remaining overlying layer 1424 is removed by any suitable operation. In some embodiments, the remaining underlying layer 1422 serves as a hardmask during the etching of the capping layer 130 and the insulating layer 120.

Figure 12:
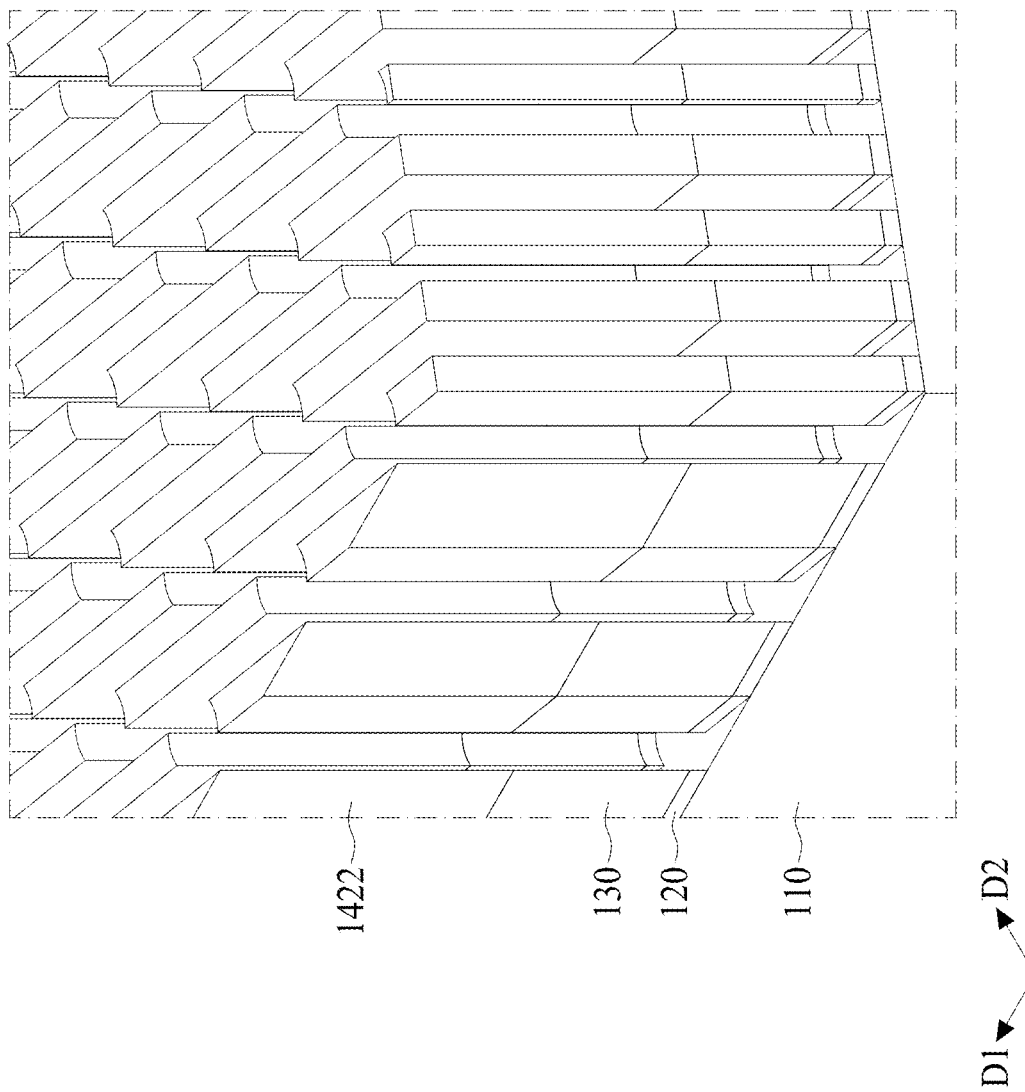
Figure 13:
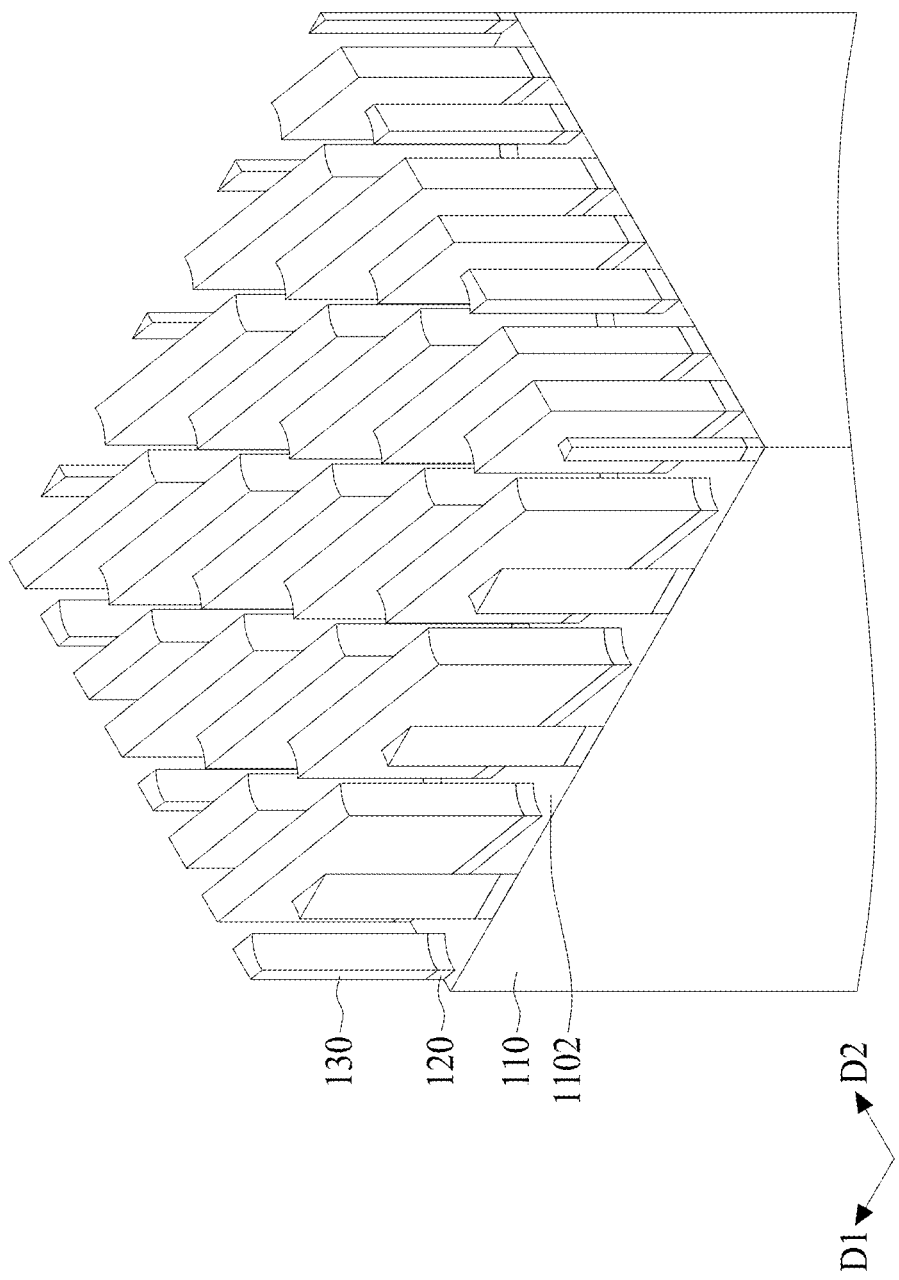

Referring to FIGS. 12 and 13, in some embodiments, portions of the capping layer 130 and the insulating layer 120 exposed through the remaining underlying layer 1422 are removed according to step 316 in FIG. 3. In some embodiments, the portions of the capping layer 130 and the insulating layer 120 are removed to expose the supporting substrate 110. In some embodiments, the patterning process stops at the supporting substrate 110. In some embodiments, the portions of the capping layer 130 and the insulating layer 120 are removed by any suitable operation, such as dry etching. After the patterning of the capping layer 130 and the insulating layer 120, the remaining underlying layer 1422 is removed, by any suitable operation. The remaining capping layer 130 and the insulating layer 120 serve as a hardmask when the supporting substrate 110 is subsequently etched.

Figure 14:
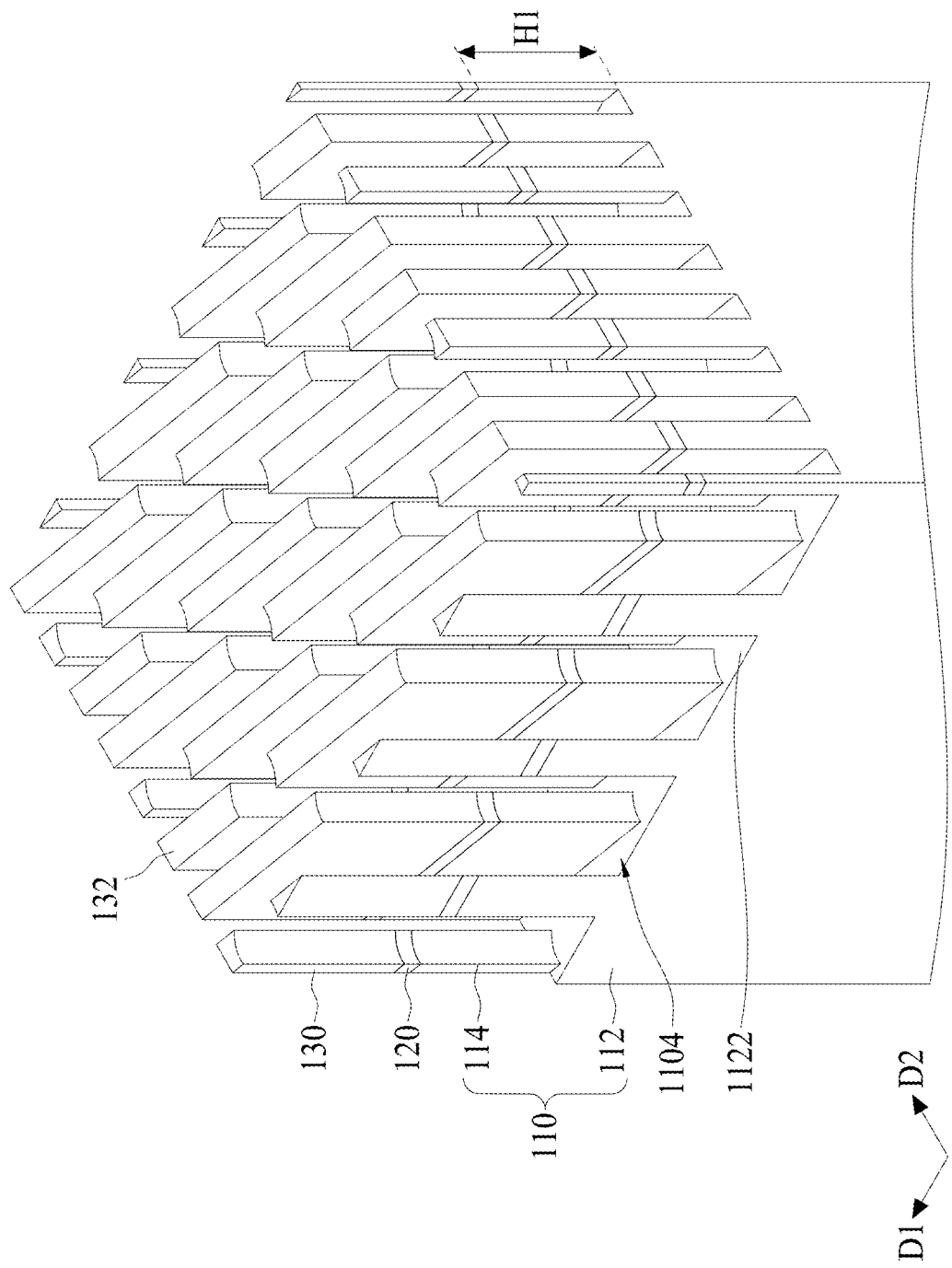

Referring to FIG. 14, in some embodiments, the supporting substrate 100 is etched through the capping layer 130 and the insulating layer 120 to form a recess 1104 in the supporting substrate 110 according to step 318 in FIG. 3. In some embodiments, the remaining supporting substrate 110 includes a base 112, and a plurality of protrusions 114 extends from a surface 1122 of the base 112. In some embodiments, the capping layer 130 and the insulating layer 120 overlie the protrusions 114. In some embodiments, the protrusions 114 have a height H1, from the surface 1122 to the insulating layer 120, in a range between 30 and 200 nm. In some embodiments, the supporting substrate 110 is etched by any suitable operation, such as dry etching.

Figure 15:
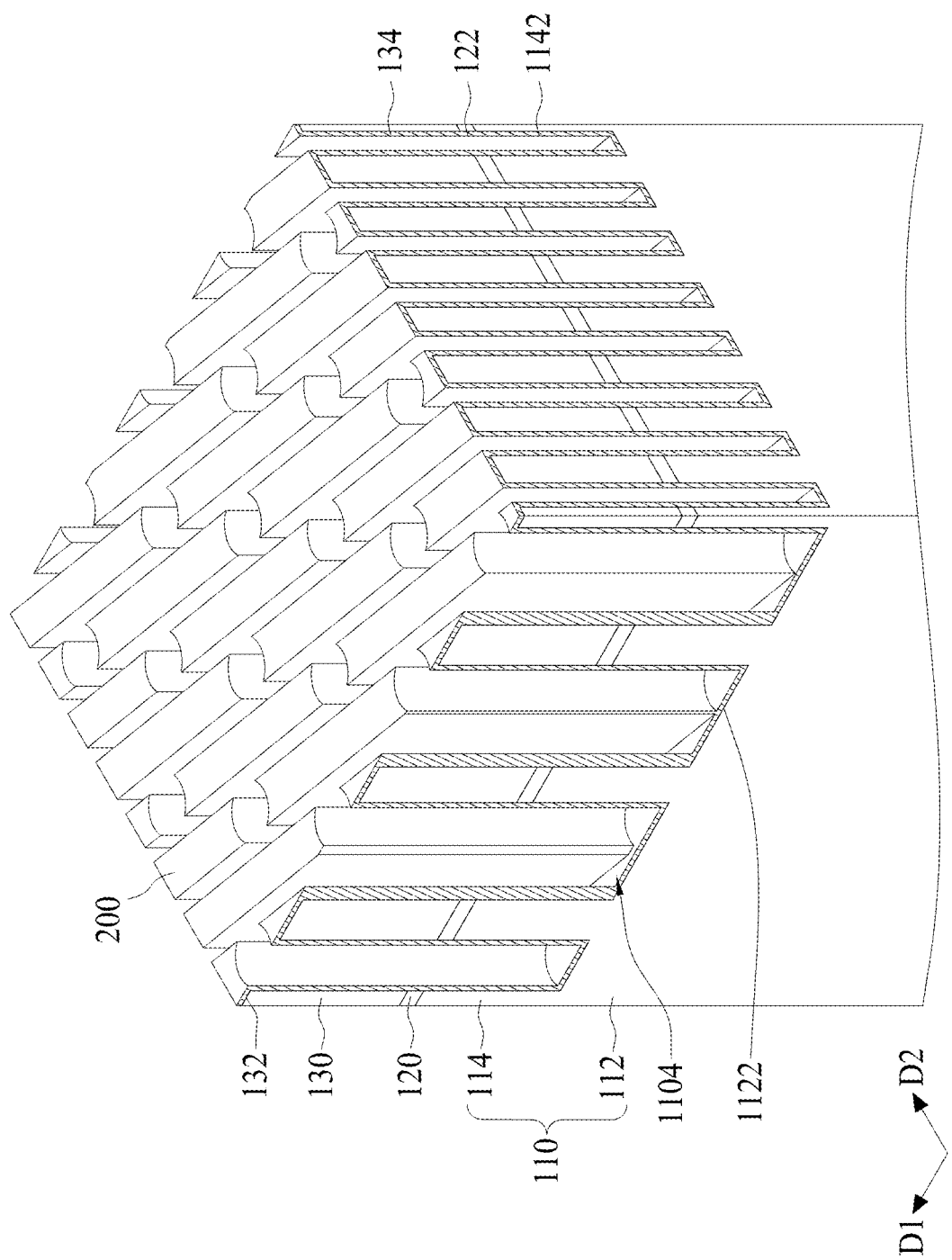

Referring to FIG. 15, in some embodiments, a passivation liner 200 is deposited on the capping layer 130 and into the recess 1104 according to step 320 in FIG. 3. In some embodiments, the passivation liner 200 is deposited on a top surface 132 of the capping layer 130, sidewalls 134 of the capping layer 130, sidewalls 122 of the insulating layer 120, sidewalls 1142 of the protrusions 114, and the surface 1122 of the base 112. In some embodiments, the passivation liner 200 is a substantially conformal layer. In some embodiments, the passivation liner 200 has a uniform thickness. In some embodiments, the passivation liner 200 includes oxide. In some embodiments, the passivation liner 200 may be formed using an atomic layer deposition process.

Figure 16:
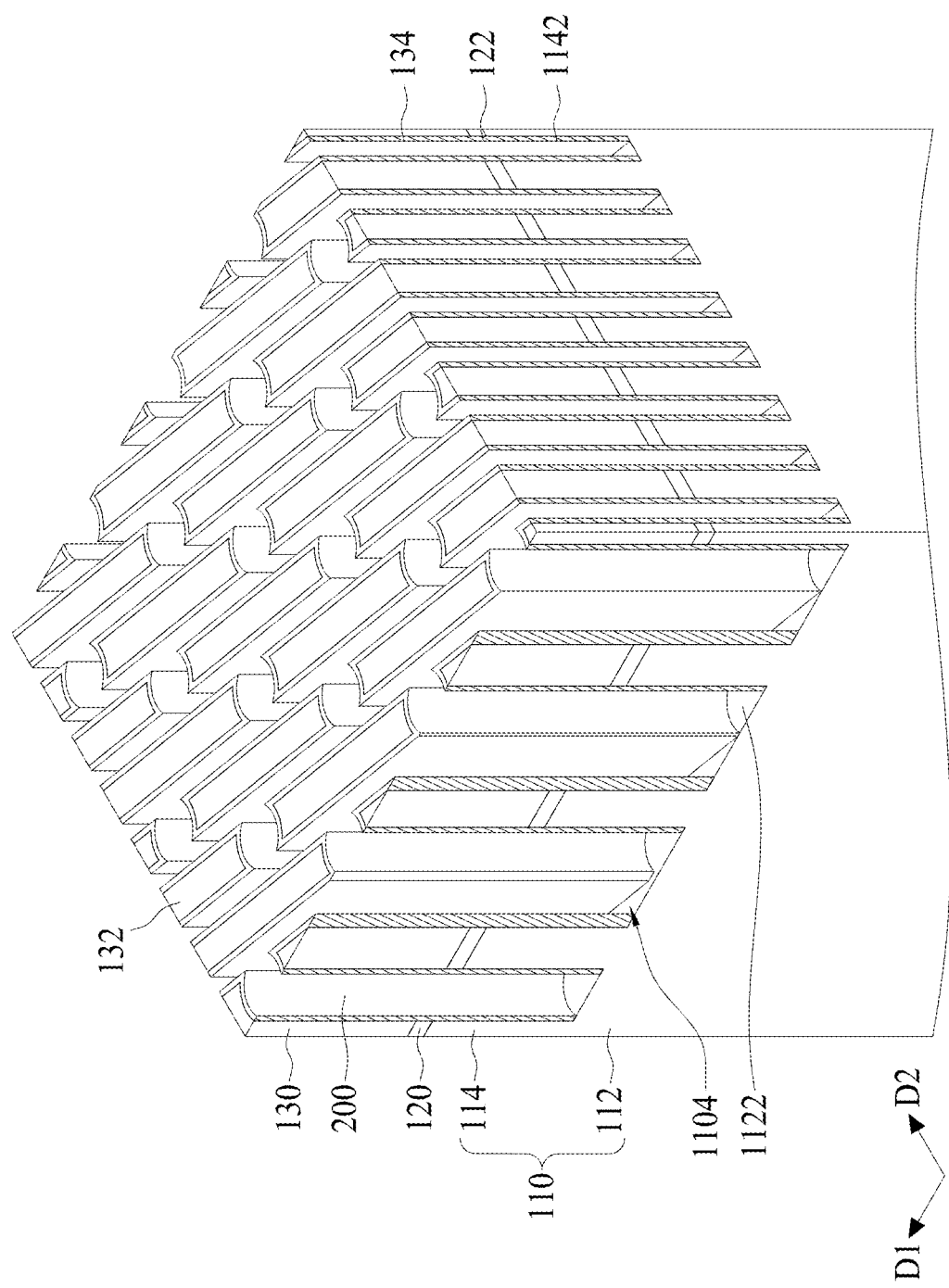

Referring to FIG. 16, in some embodiments, a portion of the passivation liner 200 is removed to expose the top surface 132 and the surface 1122. In some embodiments, the portion of the passivation liner 200 disposed on the top surface 132 and the surface 1122 is removed, while the portion of the passivation liner 200 disposed on the sidewalls 1142, 122, 134 is left to protect against undercutting or notches of the sidewalls 1142 of the protrusions 114 when the base 112 is subsequently etched. In some embodiments, the portion of the passivation liner 200 is removed using an anisotropic etching process.

Figure 17:
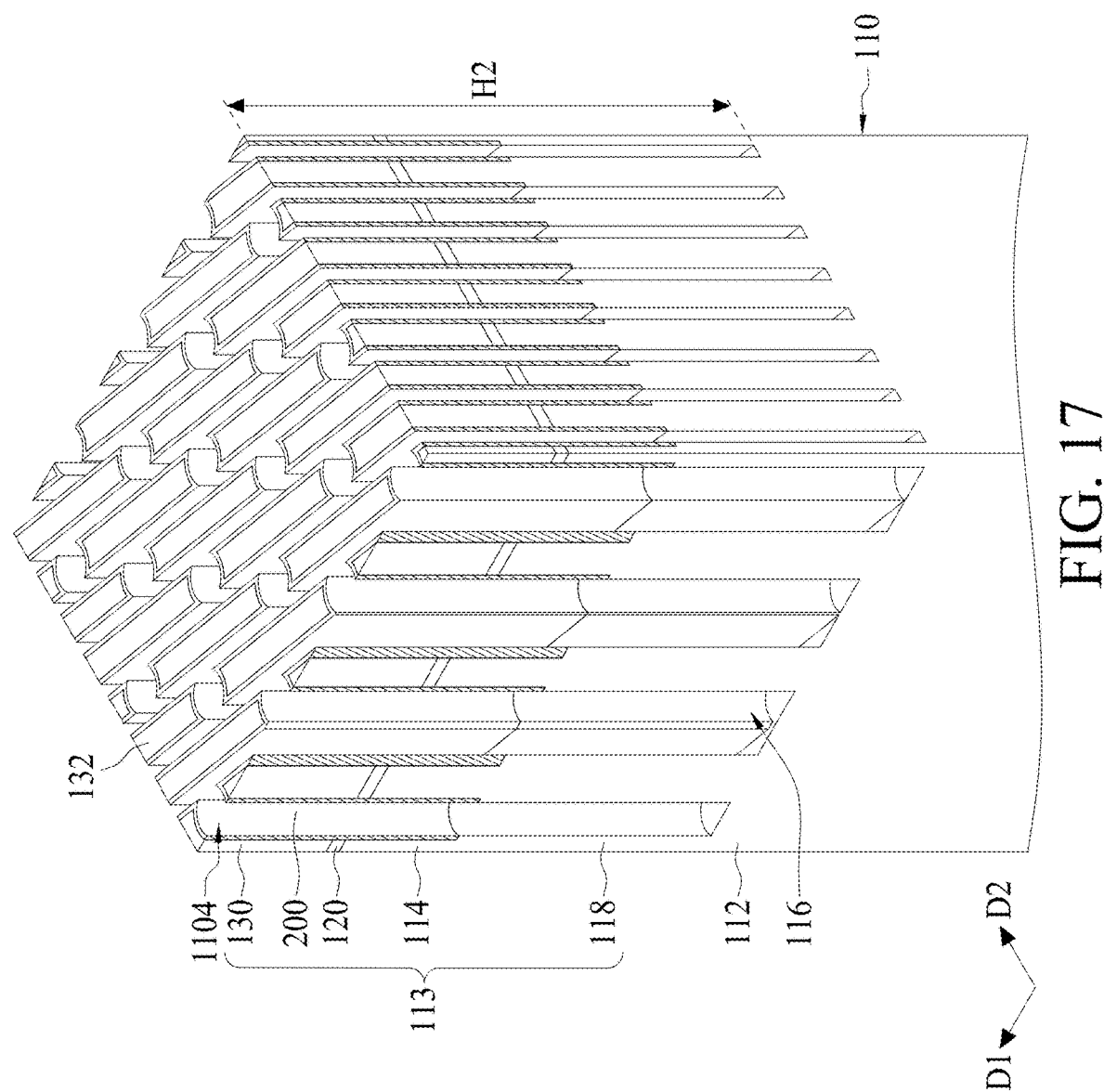

Referring to FIG. 17, in some embodiments, the supporting substrate 110 is etched through the recess 1104 to form a trench 116 in the base 112 according to step 322 in FIG. 3. As a result, a plurality of pillars 118 underlying the protrusions 114 and a plurality of islands 113 are formed, wherein each of the islands 113 includes the pillar 118, the protrusion 114, the insulating layer 120, the capping layer 130, and the passivation liner 200. In some embodiments, the islands 113 have a height H2 in a range between 180 and 400 nm. In some embodiments, the base 112 is etched by any suitable operation, such as dry etching.

Figure 18:
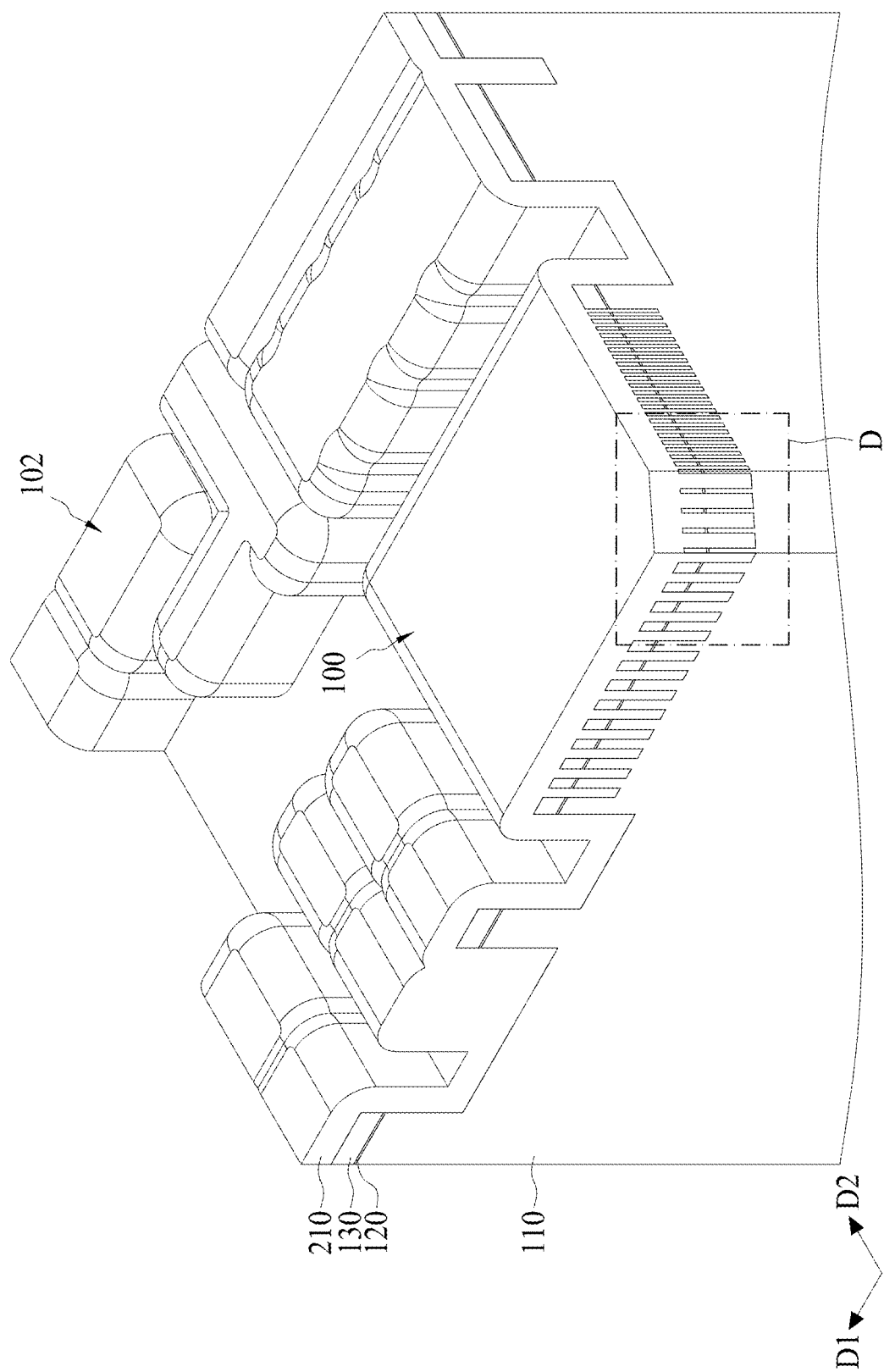
FIG. 18 illustrates a perspective view of an intermediate stage in the formation of the semiconductor structure in accordance with some embodiments of the present disclosure.
Figure 19:
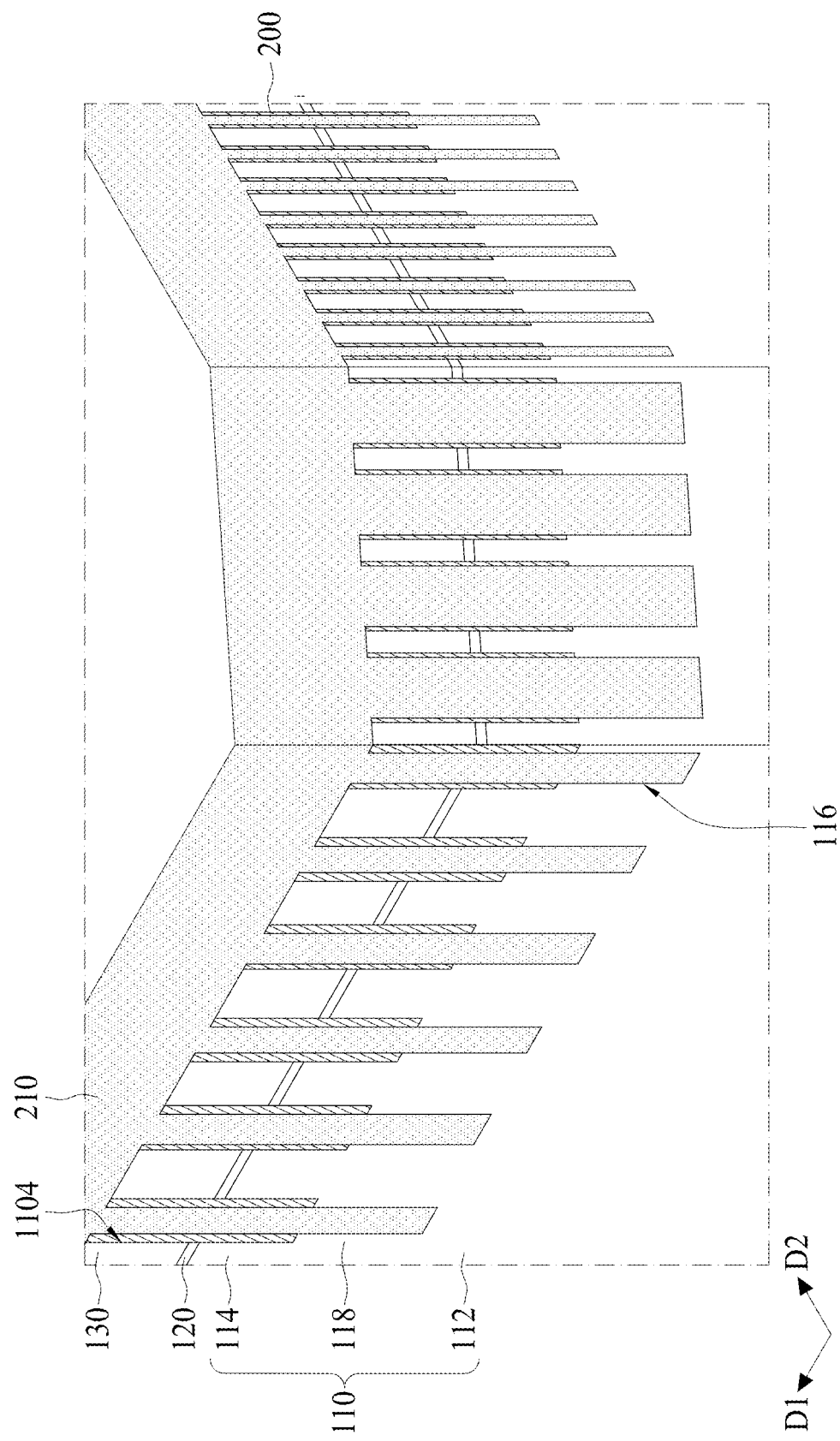
FIG. 19 is a close-up view of an area D of FIG. 18.

Referring to FIGS. 18 and 19, in some embodiments, an isolation layer 210 is deposited on the capping layer 130 and in the recess 1104 and the trench 116. In some embodiments, the isolation layer 210 has a thickness sufficient to fill the trench 116 and the recess 1104. In some embodiments, the protrusions 114 are isolated from the isolation layer 210 through the passivation liner 200. In some embodiments, the isolation layer 210 includes silicon oxide.

Figure 20:
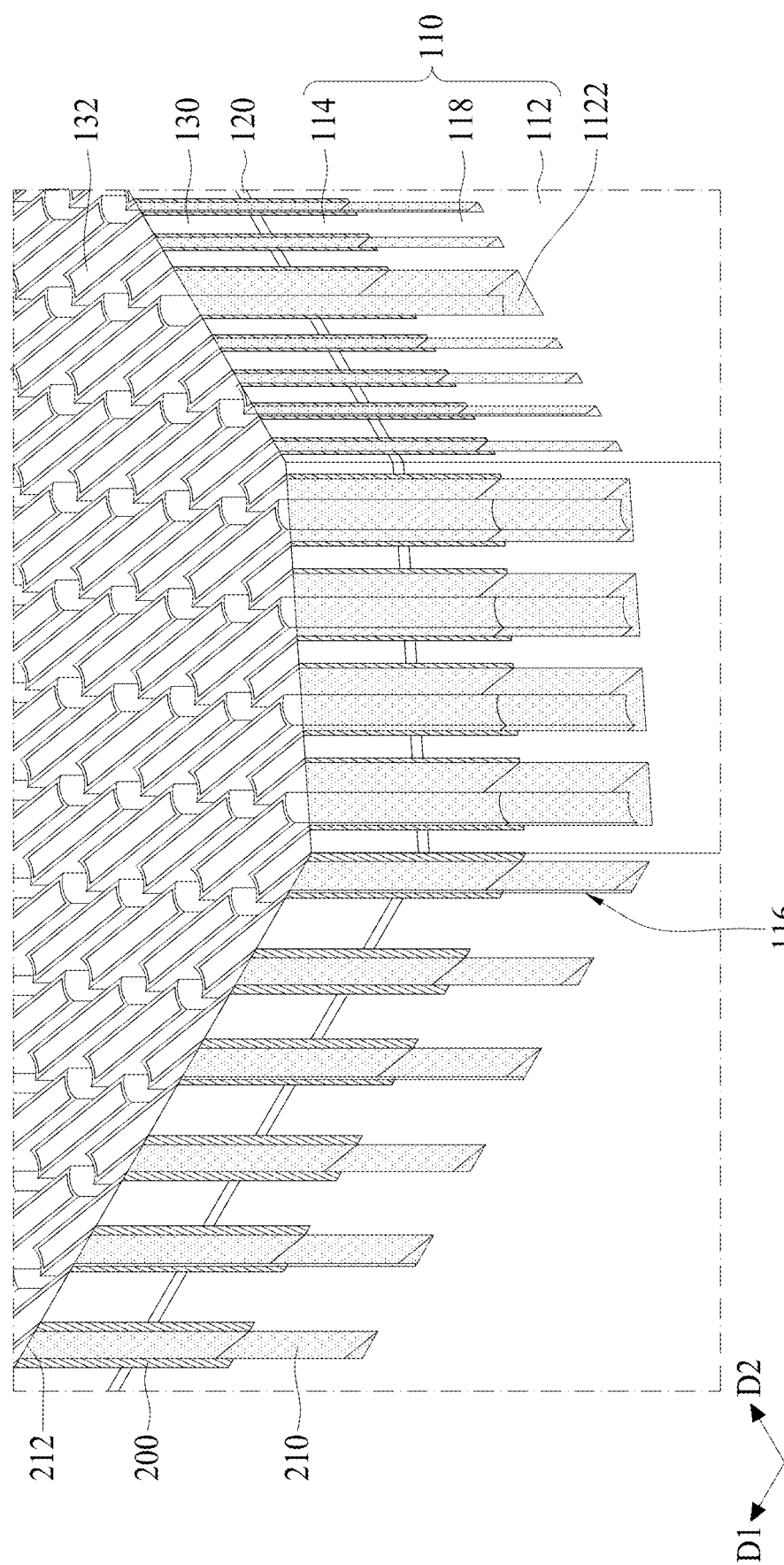
FIG. 20 illustrates a perspective view of an intermediate stage in the formation of the semiconductor structure in accordance with some embodiments of the present disclosure.

Referring to FIG. 20, in some embodiments, a planarizing process is performed to expose the capping layer 130. Accordingly, the semiconductor structure 10 shown in FIGS. 1 and 2 are completely formed. In some embodiments, an upper surface 212 of the isolation layer 210 is coplanar with the top surface 132 of the capping layer 130.

One aspect of the present disclosure provides a semiconductor structure. The semiconductor structure includes a base, a plurality of islands, and an isolation layer. At least one of the plurality of islands includes a pillar, a protrusion, a capping layer, and a passivation liner; the pillar extends from an upper surface of the base, the protrusion is connected to the pillar, and the capping layer is disposed on the protrusion. The passivation liner is disposed on sidewalls of the protrusion and the capping layer. The isolation layer surrounds the islands.

One aspect of the present disclosure provides a method of processing a semiconductor structure. The method includes steps of providing a supporting substrate; forming a capping layer and a hardmask stack on the supporting substrate; patterning the hardmask stack to form a plurality of blocks overlying the capping layer; patterning the capping layer using the blocks as a mask; patterning the supporting substrate through the remaining capping layer to form a plurality of protrusions; depositing a passivation liner on sidewalls of the remaining capping layer and the protrusions; patterning the remaining supporting substrate to from a plurality of pillars underlying the protrusions; and depositing a first isolation layer to encircle the pillars, the protrusions, and the remaining capping layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the is corresponding embodiments described herein may be utilized according to the present disclosure. Accordingly, the appended claims are intended to include within their scope such processes, machines, manufacture, compositions of matter, means, methods and steps.

What is claimed is:

1. A semiconductor structure, comprising:
   a base;
   a plurality of islands, wherein at least one of the plurality of islands comprises:
   a pillar extending from an upper surface of the base;
   a protrusion connected to the pillar;
   a capping layer disposed on the protrusion; and
   a passivation liner disposed on sidewalls of the protrusion and the capping layer; and
   an isolation layer encircling the islands;
   wherein the protrusion is isolated from the isolation layer through the passivation liner, and the pillar is directly coupled with the isolation layer.

2. The semiconductor structure of claim 1, wherein the islands have a height in a range between 180 and 400 nm.

3. The semiconductor structure of claim 1, wherein the protrusions have a height in a range between 30 and 200 nm.

4. The semiconductor structure of claim 1, further comprising an insulating layer sandwiched between the protrusion and the capping layer, wherein sidewalls of the insulating layer are covered by the passivation liner.

5. The semiconductor structure of claim 1, wherein the base, the pillars and the protrusions are integrally formed.

6. The semiconductor structure of claim 1, wherein a top surface of the capping layer is coplanar with an upper surface of the isolation layer.

* * * * *